United States Patent
Wang et al.

(10) Patent No.: US 11,296,161 B2
(45) Date of Patent: Apr. 5, 2022

(54) DISPLAY PANEL AND DISPLAY DEVICE

(71) Applicant: BOE Technology Group Co., Ltd., Beijing (CN)

(72) Inventors: Youwei Wang, Beijing (CN); Song Zhang, Beijing (CN); Peng Cai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 89 days.

(21) Appl. No.: 16/962,563

(22) PCT Filed: Dec. 25, 2019

(86) PCT No.: PCT/CN2019/128313
§ 371 (c)(1),
(2) Date: Jul. 16, 2020

(87) PCT Pub. No.: WO2020/143451
PCT Pub. Date: Jul. 16, 2020

(65) Prior Publication Data
US 2020/0343323 A1    Oct. 29, 2020

(30) Foreign Application Priority Data

Jan. 7, 2019    (CN) .......................... 201910012335.8

(51) Int. Cl.
*H01L 27/32*    (2006.01)
(52) U.S. Cl.
CPC ...... *H01L 27/3246* (2013.01); *H01L 27/3234* (2013.01)

(58) Field of Classification Search
CPC ........................ H01L 27/3246; H01L 27/3234
See application file for complete search history.

(56) References Cited

U.S. PATENT DOCUMENTS

| 2015/0243704 A1 | 8/2015 | Lee et al. |
| 2017/0205959 A1 | 7/2017 | Seong |
| 2017/0221982 A1 | 8/2017 | Park |
| 2020/0035770 A1* | 1/2020 | Jiang ..................... H01L 51/502 |

(Continued)

FOREIGN PATENT DOCUMENTS

| CN | 107026245 A | 8/2017 |
| CN | 107037921 A | 8/2017 |

(Continued)

OTHER PUBLICATIONS

Office Action Action for corresponding Chinese Application No. 201910012335.8 dated May 28, 2020.

*Primary Examiner* — Peter Bradford
(74) *Attorney, Agent, or Firm* — Arent Fox LLP; Michael Fainberg

(57) ABSTRACT

Disclosed are a display panel and a display device. The display panel includes a display area and an opening area, where the opening area is configured to accommodate an optical component, and the display area at least partially surrounds the opening area; where the display area includes edge pixel defining structures and conventional pixel defining structures, and the edge pixel defining structures are closer to the opening area than the conventional pixel defining structures; where a reflectivity of each edge pixel defining structure is greater than a reflectivity of each conventional pixel defining structure.

18 Claims, 2 Drawing Sheets

(56) References Cited

U.S. PATENT DOCUMENTS

| | | | |
|---|---|---|---|
| 2020/0075692 A1* | 3/2020 | Park | ................... H01L 51/5253 |
| 2020/0343323 A1 | 10/2020 | Wang et al. | |
| 2021/0200020 A1* | 7/2021 | Kim | .................... H04N 5/2254 |

FOREIGN PATENT DOCUMENTS

| | | | | |
|---|---|---|---|---|
| CN | 107452894 A | | 12/2017 | |
| CN | 107784989 A | | 3/2018 | |
| CN | 108281470 A | | 7/2018 | |
| CN | 108417737 A | | 8/2018 | |
| CN | 108574054 A | | 9/2018 | |
| CN | 109037476 A | | 12/2018 | |
| CN | 109360840 A | * | 2/2019 | |
| CN | 109742111 A | | 5/2019 | |
| CN | 113193020 A | * | 7/2021 | |
| EP | 3719846 A1 | * | 10/2020 | ......... H01L 27/3272 |
| KR | 20200073549 A | * | 6/2020 | ........... G06F 3/0412 |

\* cited by examiner

DISPLAY PANEL AND DISPLAY DEVICE

CROSS REFERENCE TO RELATED APPLICATION

This application is a national phase entry under 35 U.S.C. § 371 of International Application No. PCT/CN2019/128313, filed on Dec. 25, 2019, which claims the priority of Chinese Patent Application No. 201910012335.8, filed with the China National Intellectual Property Administration on Jan. 7, 2019, and entitled "Display Panel and Display Device", which is hereby incorporated by reference in its entirety.

FIELD

The present disclosure relates to the field of display technology, and particularly relates to a display panel and a display device.

BACKGROUND

Organic electroluminescent devices (OLEDs) are known as the most promising display devices due to their self-luminescence, high brightness, high contrast, low operating voltage, and applicability to flexible displays.

At present, to meet the requirements of full-screen and narrow-bezel, an existing OLED display panel is generally provided with an opening area for installing an optical component (such as a camera), while requiring normal display in a light emitting area at edges of the opening area. This causes some problems accordingly. For example, light in the display area is reflected toward the opening area, thereby causing light leakage to some extent at the edges of the opening area, which results in a decreased contrast of the opening area, and thus, functions of the optical component installed subsequently is also affected.

SUMMARY

An embodiment of the present disclosure provides a display panel, including a display area and an opening area, where the opening area is configured to accommodate an optical component, and the display area at least partially surrounds the opening area. The display area has edge pixel defining structures and conventional pixel defining structures, where the edge pixel defining structures are closer to the opening area than conventional pixel defining structures; and the reflectivities of the edge pixel defining structures are greater than reflectivities of the conventional pixel defining structures.

In some embodiments, the display area includes OLED display units in array; and each edge pixel defining structure includes at least two blocking dams which are located between adjacent OLED display units and arranged along a direction facing away from the opening area.

In some embodiments, the height of the blocking dam close to the opening area is greater than that of the blocking dam far away from the opening area.

In some embodiments, each blocking dam includes a barrier layer and a defining layer covering the barrier layer.

In some embodiments, each OLED display unit includes an anode layer, a light emitting layer and a cathode layer stacked in that order on a substrate. Where the barrier layer is made of the same material and prepared in the same layer as the anode layer; and the defining layer is made of the same material and prepared in the same layer as the conventional pixel defining structures.

In some embodiments, the surface of the edge pixel defining structure has a reflective protrusion.

In some embodiments, the edge pixel defining structure is made of an opaque material.

In some embodiments, the distance between each edge pixel defining structure and the opening area is smaller than 400 nm; and the distance between each conventional pixel defining structure and the opening area is larger than or equal to 400 nm.

In some embodiments, the optical component is an optical camera.

An embodiment of the present disclosure provides a display device including the display panel according to any of the foregoing technical solutions.

DETAILED DESCRIPTION OF THE EMBODIMENTS

The technical solutions in the embodiments of the present disclosure will be described clearly and completely below in conjunction with the accompanying drawings in the embodiments of the present disclosure. Obviously, the described embodiments are only a part of the embodiments of the present disclosure, and not all the embodiments. Based on the embodiments in the present disclosure, all other embodiments obtained by those of ordinary skill in the art without any creative efforts fall within the protection scope of the present disclosure.

Figure 1:
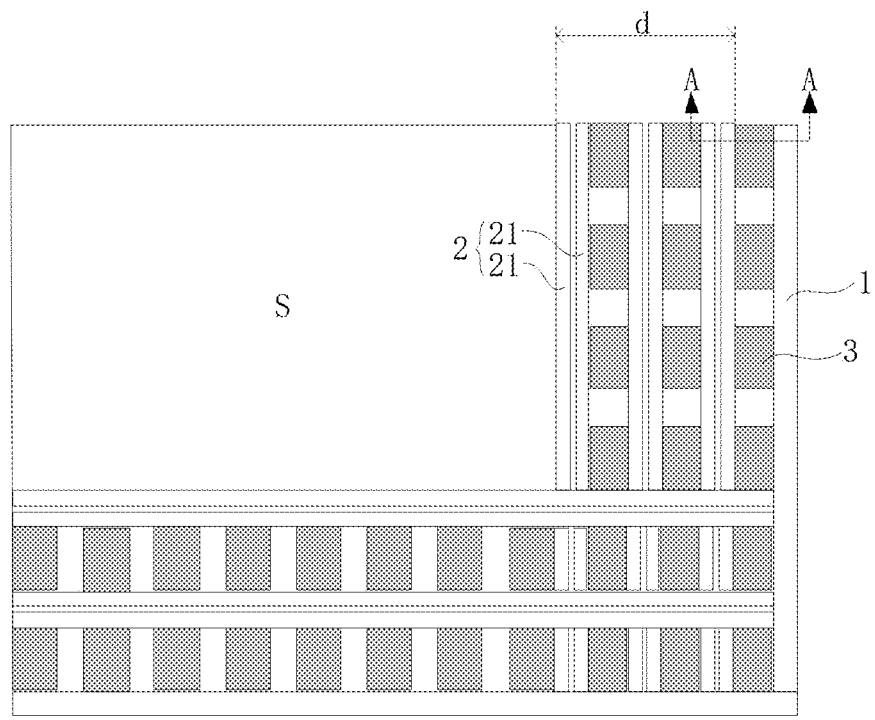
FIG. 1 is a partial structure diagram of a display panel according to an embodiment of the present disclosure.

As shown in FIG. 1, an embodiment of the present disclosure provides a display panel, including a display area and an opening area S, where the opening area S is configured to accommodate an optical component, and the display area at least partially surrounds the opening area S; the display area includes edge pixel defining structures 2, and conventional pixel defining structures 1, where the edge pixel defining structures 2 are closer to the opening area S than the conventional pixel defining structures 1; and the reflectivities of the edge pixel defining structures 2 are greater than the reflectivities of the conventional pixel defining structures 1.

In the above-mentioned display panel, since the edge pixel defining structures 2 have a reflectivity greater than that of the conventional pixel defining structures 1, light reflection at edges of the opening area S is increased, so that light incident into the opening area S may be reduced, and the contrast of the opening area S may be increased, and thus the performance of the optical component in the opening area S may be improved, which provides a guarantee for the subsequent installation of the optical component.

As shown in FIG. 1, in some embodiments, the edge pixel defining structures 2 may be the part of pixel defining layer (PDL) within 400 nm from the edge of the opening area S; accordingly, the part of the PDL out the range of 400 nm distance from the opening area is the conventional pixel defining structure 1; that is, the distance d between an edge pixel defining structure 2 farthest from the opening area S and the opening area S is smaller than 400 nm; and the distance between a conventional pixel defining structure 1 closest to the opening area S and the opening area S is larger than or equal to 400 nm. It should be noted that only two or three rows of edge pixel defining structure close to the edges of the opening area S are shown in FIG. 1, which does not mean that only two or three rows of edge pixel defining structures are included actually at the edges of the opening area S. FIG. 1 is only a schematic representation of edge structures of the opening area S, and does not limit the number and size of the structures in the embodiments of the present application.

Figure 2:
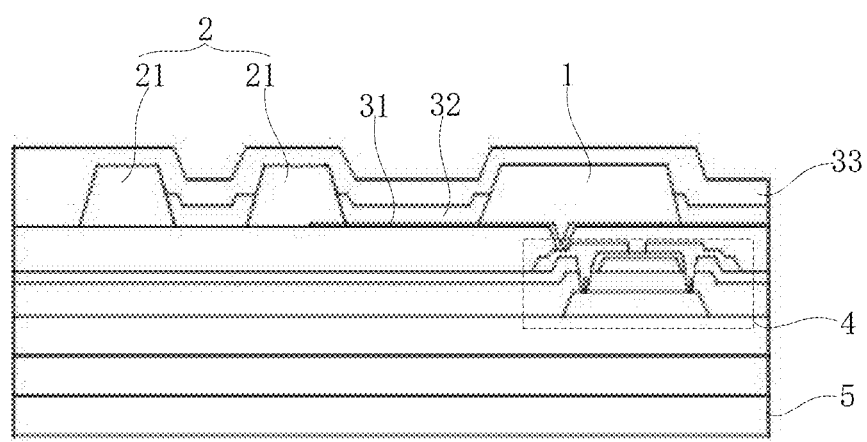
FIG. 2 is a sectional view of the display panel along a line A-A as indicated in FIG. 1 according to an embodiment of the present disclosure.
Figure 3:
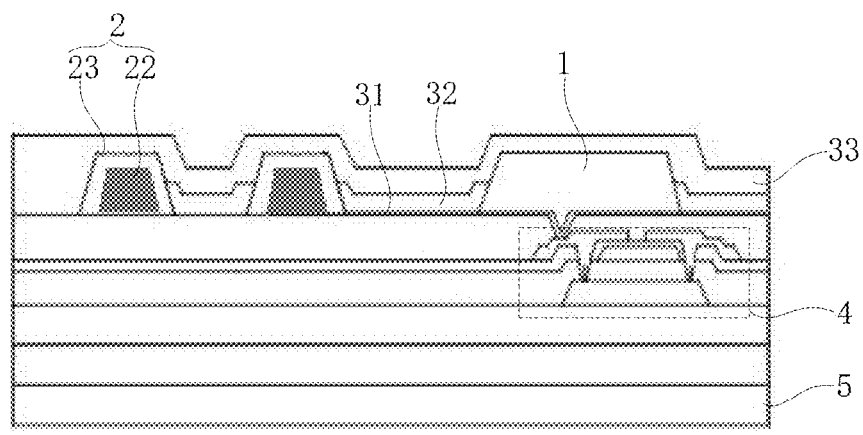
FIG. 3 is a sectional view of a display panel along the line A-A as indicated in FIG. 1 according to another embodiment of the present disclosure.

As shown in FIGS. 1-3, in some embodiments, the display area includes pixel structures in array. Each pixel structure includes one OLED display unit 3, and each OLED display unit 3 includes an anode layer 31, a light emitting layer 32 and a cathode layer 33 stacked in that order on a substrate 5. The anode layer 31 of each OLED display unit 3 is an independent structure, and the cathode layers 33 of all OLED display units 3 may be a whole layer of continuous structure. Further, each pixel structure further includes a thin film transistor (TFT) 4, and the anode layer 31 of each OLED display unit 3 is electrically connected to a drain of the corresponding TFT 4.

In some embodiments, the position setting and essential functions of the edge pixel defining structures 2 and the conventional pixel defining structures 1 are same. Both are located between the pixel structures, and function to define and isolate the pixel structures and facilitate printing of the light emitting layers 32 of the OLED units, etc.

As shown in FIGS. 1-3, in an embodiment, each edge pixel defining structure 2 includes at least two blocking dams 21 between adjacent OLED display units 3, and the at least two blocking dams 21 are arranged along a direction facing away from the opening area S, thereby increasing a reflection path of display light between the adjacent pixel structures, and improving the reflectivity of the display light in the edge pixel defining structure 2, to reduce the light reaching the opening area S.

In some embodiments, the height of the blocking dam 21 close to the opening area S is greater than that of the blocking dam 21 far away from the opening area S, to enhance the effective reflection toward the display area, thereby effectively reducing the light incident into the opening area S.

In some embodiments, the edge pixel defining structures 2 may be made of the same material and be prepared in the same layer as the conventional pixel defining structures 1. Furthermore, compared with the existing OLED display panel, the display panel of this embodiment does not require any additional process in a manufacturing method thereof, and there is no change in the manufacturing process.

As shown in FIG. 3, in an embodiment, a barrier layer 22 may be provided inside each edge pixel defining structure 2 to further improve the reflectivity of the display light in the edge pixel defining structure 2, that is, the edge pixel defining structure 2 includes a barrier layer 22 and a defining layer 23 covering the barrier layer 22, and the shape of the barrier layer 22 may be similar to that of the edge pixel defining structure 2. As shown in FIG. 3, in the case where the edge pixel defining structure 2 includes two or more blocking dams 21, each blocking dam 21 includes a two-layer structure of a barrier layer 22 and a defining layer 23; of course, the overall shape of the edge pixel defining structure 2 may also be same as that of the conventional pixel defining structure 1, and the difference lies in that the edge pixel defining structure 2 includes a two-layer structure of a barrier layer 22 and a defining layer 23.

In some embodiments, light may be refracted or reflected between the barrier layer 22 and the defining layer 23, thereby improving the reflectivity of the display light in the entire edge pixel defining structure 2, to achieve the purpose of reducing the light reaching the opening area S.

In some embodiments, the barrier layer 22 of the edge pixel defining structure 2 may be made of the same material and prepared in the same layer as the anode layer 31 of the OLED display unit 3; and the defining layer 23 is made of the same material and prepared in the same layer as the conventional pixel defining structures 1. Furthermore, compared with the existing OLED display panel, the display panel of this embodiment does not require any additional process in a manufacturing method thereof, and there is no change in the manufacturing process.

In some embodiments, the material of the barrier layer 22 and the anode layer 31 may be a metal or metal oxide, such as ITO.

In some embodiments, the edge pixel defining structure 2 may also be prepared by using an opaque material to improve the reflectivity of the edge pixel defining structure 2, thereby effectively reflecting the display light back to the light emitting area to avoid an influence on the optical component in the opening area S.

Figure 4:
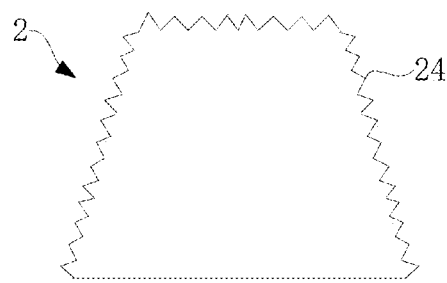
FIG. 4 is a partial structure diagram of an edge pixel defining structure according to an embodiment of the present disclosure.
Figure 5:
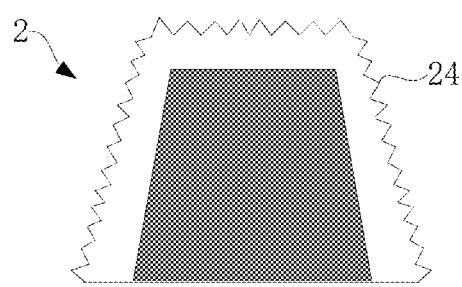
FIG. 5 is a partial structure diagram of an edge pixel defining structure according to another embodiment of the present disclosure.

As shown in FIGS. 4 and 5, based on the above embodiments, in a specific embodiment, the surface of the edge pixel defining structure 2 may have a reflective protrusion 24 to improve the reflectivity of the display light in the edge pixel defining structure 2, thereby effectively reflecting the display light back to the light emitting area to avoid an influence on the optical component in the opening area S. Specifically, the reflective protrusion 24 may be prepared by an ashing process.

In some embodiments, the edge pixel defining structure 2 may have the same overall shape as the conventional pixel defining structure 1, while differs in that the surface of the edge pixel defining structure 2 has a reflective protrusion 24; or the edge pixel defining structure 2 includes two or more blocking dams 21, and the surface of each blocking dam 21 is provided with a reflective protrusion 24.

In some embodiments, the reflective protrusion 24 may be pyramid-shaped, circular-arc-shaped, strip-shaped, etc., so long as the reflectivity of the edge pixel defining structure 2 can be improved to prevent the display light from reaching the opening area S.

In some embodiments, the optical component may be an optical camera.

In some embodiments, the display panel may be a flexible OLED display panel.

In addition, an embodiment of the present disclosure further provides a display device, including the display panel in any of the above embodiments.

In some embodiments, the display device may be a flexible display device, such as a mobile phone, a tablet computer, an e-reader or other product.

Evidently those skilled in the art can make various modifications and variations to the embodiments of the present disclosure without departing from the spirit and scope of the present disclosure. Thus, the present disclosure is also intended to encompass these modifications and variations thereto so long as the modifications and variations come into the scope of the claims appended to the present disclosure and their equivalents.

What is claimed is:

1. A display panel, comprising:
an opening area configured to accommodate an optical component; and
a display area at least partially surrounding the opening area and comprising:
edge pixel defining structures; and
conventional pixel defining structures;
wherein the edge pixel defining structures are closer to the opening area than the conventional pixel defining structures; and
reflectivities of the edge pixel defining structures are greater than reflectivities of the conventional pixel defining structures.

2. The display panel according to claim 1, wherein the display area comprises Organic Light Emitting Diode (OLED) display units in array; and each edge pixel defining structure comprises at least two blocking dams;
wherein the at least two blocking dams are located between adjacent OLED display units and arranged along a direction facing away from the opening area.

3. The display panel according to claim 2, wherein a height of a blocking dam close to the opening area is greater than a height of a blocking dam far away from the opening area.

4. The display panel according to claim 2, wherein each blocking dam comprises a barrier layer and a defining layer covering the barrier layer.

5. The display panel according to claim 4, wherein each OLED display unit comprises an anode layer, a light emitting layer and a cathode layer stacked in that order on a substrate;
wherein the barrier layer is made of a same material and prepared in a same layer as the anode layer; and the defining layer is made of a same material and prepared in a same layer as the conventional pixel defining structures.

6. The display panel according to claim 1, wherein a surface of each edge pixel defining structure has a reflective protrusion.

7. The display panel according to claim 1, wherein the edge pixel defining structures are made of an opaque material.

8. The display panel according to claim 1, wherein a distance between each edge pixel defining structure and the opening area is smaller than 400 nm; and a distance between each conventional pixel defining structure and the opening area is larger than or equal to 400 nm.

9. The display panel according to claim 1, wherein the optical component is an optical camera.

10. A display device, comprising a display panel, wherein the display panel comprises:
an opening area configured to accommodate an optical component; and
a display area at least partially surrounding the opening area and comprising:
edge pixel defining structures; and
conventional pixel defining structures;
wherein the edge pixel defining structures are closer to the opening area than the conventional pixel defining structures; and
reflectivities of the edge pixel defining structures are greater than reflectivities of the conventional pixel defining structures.

11. The display device according to claim 10, wherein the display area comprises Organic Light Emitting Diode (OLED) display units in array; and each edge pixel defining structure comprises at least two blocking dams;
wherein the at least two blocking dams are located between adjacent OLED display units and arranged along a direction facing away from the opening area.

12. The display device according to claim 11, wherein a height of a blocking dam close to the opening area is greater than a height of a blocking dam far away from the opening area.

13. The display device according to claim 11, wherein each blocking dam comprises a barrier layer and a defining layer covering the barrier layer.

14. The display device according to claim 13, wherein each OLED display unit comprises an anode layer, a light emitting layer and a cathode layer stacked in that order on a substrate;
wherein the barrier layer is made of a same material and prepared in a same layer as the anode layer; and the defining layer is made of a same material and prepared in a same layer as the conventional pixel defining structures.

15. The display device according to claim 10, wherein a surface of each edge pixel defining structure has a reflective protrusion.

16. The display device according to claim 10, wherein the edge pixel defining structures are made of an opaque material.

17. The display device according to claim 10, wherein a distance between each edge pixel defining structure and the opening area is smaller than 400 nm; and a distance between each conventional pixel defining structure and the opening area is larger than or equal to 400 nm.

18. The display device according to claim 10, wherein the optical component is an optical camera.

* * * * *